(12) United States Patent
Keller et al.

(10) Patent No.: US 9,436,338 B2
(45) Date of Patent: Sep. 6, 2016

(54) ACTIVE MATRIX CAPACITIVE TOUCH SENSOR

(71) Applicant: MICROSOFT TECHNOLOGY LICENSING, LLC, Redmond, WA (US)

(72) Inventors: Sean Jason Keller, Kirkland, WA (US); Tristan Thomas Trutna, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 44 days.

(21) Appl. No.: 14/579,586

(22) Filed: Dec. 22, 2014

(65) Prior Publication Data
US 2016/0179244 A1 Jun. 23, 2016

(51) Int. Cl.
*G06F 3/045* (2006.01)
*G06F 3/044* (2006.01)
*H03K 3/03* (2006.01)
*G06F 3/041* (2006.01)

(52) U.S. Cl.
CPC ............. *G06F 3/044* (2013.01); *G06F 3/0414* (2013.01); *H03K 3/0315* (2013.01); *G06F 2203/04104* (2013.01); *G06F 2203/04106* (2013.01)

(58) Field of Classification Search
CPC .... G06F 3/044; G06F 3/0412; G06F 3/0414; G06F 2203/04104; G06F 2203/04106
USPC .................................................. 345/173–178
See application file for complete search history.

(56) References Cited

U.S. PATENT DOCUMENTS

| | | |
|---|---|---|
| 5,790,107 A | 8/1998 | Kasser et al. |
| 6,583,676 B2 | 6/2003 | Krah et al. |
| 6,948,388 B1 | 9/2005 | Clayton et al. |
| 8,040,321 B2 | 10/2011 | Peng et al. |
| 8,086,417 B2 | 12/2011 | Seguine |
| 8,542,215 B2 * | 9/2013 | Hanauer ............... G06F 3/0416 345/173 |

(Continued)

FOREIGN PATENT DOCUMENTS

| | | |
|---|---|---|
| CN | 101685364 A | 3/2010 |
| EP | 0455070 A1 | 11/1991 |
| WO | 0235461 A1 | 5/2002 |

OTHER PUBLICATIONS

"International Search Report and Written Opinion Issued in PCT Application No. PCT/US2015/063571", Mailed Date: Mar. 2, 2016, 11 Pages.

(Continued)

*Primary Examiner* — Vijay Shankar
(74) *Attorney, Agent, or Firm* — Brandon Roper; Judy Yee; Micky Minhas

(57) ABSTRACT

Examples of the disclosure provide an active matrix capacitive touch sensor. In some examples, a sensor includes a plurality of primary ring oscillators, a plurality of reference ring oscillators, wherein each reference ring oscillator is associated with a respective primary ring oscillator, at least one row trace, wherein each row trace is coupled to at least one primary ring oscillator and a reference ring oscillator for each primary ring oscillator, at least one sensor column trace coupled to one primary ring oscillator for each row trace, and at least one reference column trace coupled to one reference ring oscillator for each row trace. Examples of the disclosure enable touch-screen technology to provide increased pad sensitivity and multi-touch capability in a cost-effective and scalable manner.

20 Claims, 7 Drawing Sheets

(56) References Cited

U.S. PATENT DOCUMENTS

| | | |
|---|---|---|
| 2003/0067451 A1 | 4/2003 | Tagg et al. |
| 2008/0007534 A1* | 1/2008 | Peng ..................... G06F 3/044 345/173 |
| 2008/0087542 A1 | 4/2008 | Moore et al. |
| 2009/0009194 A1* | 1/2009 | Seguine ................... G01D 5/24 324/684 |
| 2011/0267309 A1 | 11/2011 | Hanauer et al. |
| 2012/0274604 A1 | 11/2012 | Norton et al. |

OTHER PUBLICATIONS

"Oscillator-Based Touch Sensor with Adaptive Resolution", In Electronic Thesis and Dissertations UCLA, Retrieved on: Aug. 27, 2014, 45 pages.

* cited by examiner

ACTIVE MATRIX CAPACITIVE TOUCH SENSOR

BRIEF DESCRIPTION OF THE DRAWINGS

Corresponding reference characters indicate corresponding parts throughout the drawings.

DETAILED DESCRIPTION

Some touch sensors include protected self-capacitance sensor arrays that enable a user to interact with an electronic device. Some existing sensors include a plurality of capacitive sensor pads that are individually wired to a controller. Individually-wired capacitive sensor pads provide sensitivity and multi-touch capabilities. However, individually-wired capacitive sensor pads come at an increased expense and, because each capacitive sensor pads is directly coupled to an input/output (I/O) port, the design does not scale well beyond a very small array. To address at least the scaling issue, some existing sensors include a plurality of capacitive sensor pads that are arranged in shared rows and columns. However, arranging capacitive sensor pads in shared rows and columns may create a ghosting effect due to a decreased pad sensitivity and multi-touch capability.

Examples of the disclosure enable an electronic device to detect a touch, including multi-touch, and implement an operation corresponding to the touch. In some examples, a capacitive sensor includes a plurality of sense pads, a primary oscillator for and coupled to each sense pad, and a reference oscillator for each primary oscillator. When a difference in a parameter, such as capacitance or oscillation frequency, is detected, an operation associated with the difference is determined and performed.

Aspects of the disclosure enable touch-input technology to provide increased pad sensitivity and multi-touch capability in a cost-effective and scalable manner. In this way, the capacitive sense pad may be used to increase a functionality of an electronic device while controlling cost and/or resources associated with the electronic device. By incorporating capacitive sense pads, primary oscillators, and reference oscillators in the manner described in this disclosure, some examples increase user interaction performance, increase system functionality, and/or improve system resource allocation.

Figure 1:
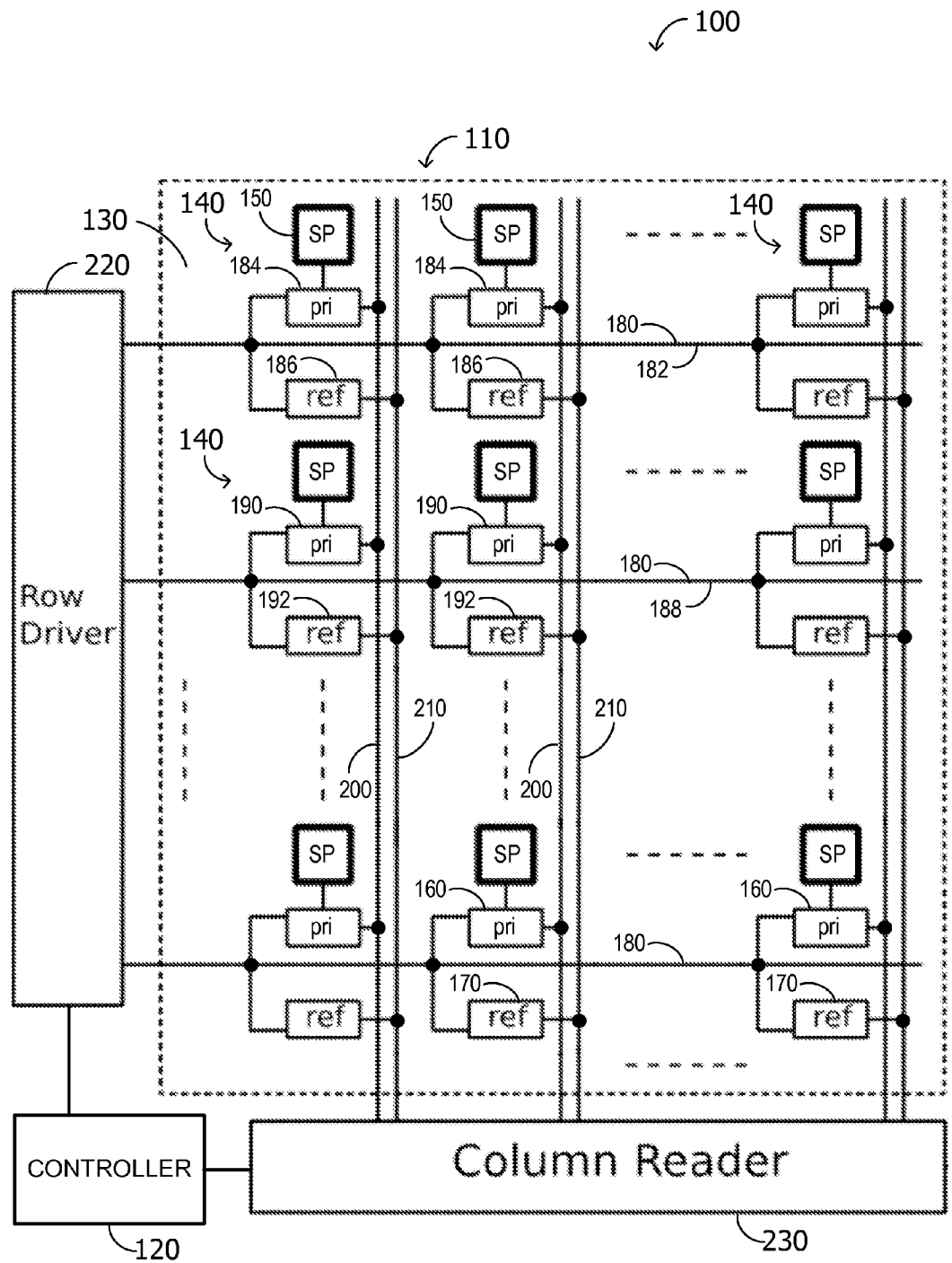
FIG. 1 is an example schematic diagram illustrating a logical architecture.

Referring to FIG. 1, an example schematic diagram of a logical architecture or system 100 is provided. In the example of FIG. 1, the system 100 includes a capacitive sensor 110 and a circuit or controller 120 coupled to the capacitive sensor 110. In an example, the capacitive sensor 110 includes a substrate 130 and a plurality of nodes 140 arranged on the substrate 130 in a grid pattern. Alternatively, the nodes 140 may be arranged in any configuration that enables the capacitive sensor 110 to function as described herein.

In an example, the capacitive sensor 110 includes a plurality of capacitive sense pads 150, a plurality of first or primary oscillators 160 coupled to the sense pads 150, and a plurality of second or reference oscillators 170 adjacent the primary oscillators 160. More specifically, in an example, each node 140 includes a respective sense pad 150, a respective primary oscillator 160, and a respective reference oscillator 170, such that there is a one-to-one-to-one ratio between the sense pads 150, the primary oscillators 160, and the reference oscillators 170. Alternatively, there may be any ratio of sense pads-to-primary oscillators-to-reference oscillators that enables the capacitive sensor 110 to function as described herein.

In an example, each primary oscillator 160 is coupled to a respective sense pad 150, such that each primary oscillator 160 is configured to identify and/or detect a change in capacitance associated with the respective sense pad 150. In an example, the reference oscillators 170 are physically adjacent and electrically separated from the primary oscillators 160, such that the reference oscillators 170 are configured to provide at least one local environmental reference (e.g., baseline) for the primary oscillators 160. In at least some examples, environmental factors (e.g., temperature, pressure, and/or strain) may affect an oscillation frequency of the primary oscillators 160 and/or the reference oscillators 170. The reference oscillators 170 provide at least one baseline that enables noise associated with the environmental factors to be reduced, such that a signal-to-noise ratio may be increased.

In an example, the capacitive sensor 110 includes a plurality of row traces 180 that extend across the substrate 130 (e.g., horizontally). Alternatively, the row traces 180 may extend in any direction that enables the capacitive sensor 110 to function as described herein. In an example, each row trace 180 is coupled to at least one primary oscillator 160 and at least one reference oscillator 170 for each primary oscillator 160 coupled to the row trace 180. For example, a first row trace 182 is coupled to a first plurality of primary oscillators 184 and a first plurality of reference oscillators 186, and a second row trace 188 is coupled to a second plurality of primary oscillators 190 and a second plurality of reference oscillators 192. Although only three row traces 180 are depicted in this example, wherein each row trace 180 is coupled to three primary oscillators 160 and three reference oscillators 170, the capacitive sensor 110 may include any number of row traces 180 coupled to any number of primary oscillators 160 and reference oscillators 170 that enables the capacitive sensor 110 to function as described herein.

In an example, the capacitive sensor 110 includes at least one first sensor column trace or, more broadly, sensor column trace 200 that extends across the substrate 130 (e.g., vertically). Alternatively, the sensor column traces 200 may extend in any direction that enables the capacitive sensor 110 to function as described herein. In an example, each sensor column trace 200 is coupled to one primary oscillator 160 for each row trace 180 in the capacitive sensor 110. For example, each row trace 180 is coupled to three primary oscillators 160 and, as such, the capacitive sensor 110 includes three sensor column traces 200. Alternatively, each row trace 180 may be coupled to any number of primary oscillators 160 and, as such, any number of sensor column traces 200 that enables the capacitive sensor 110 to function as described herein.

In an example, the capacitive sensor 110 includes at least one second sensor column trace or, more broadly, reference column trace 210 that extends across the substrate 130 (e.g., vertically). Alternatively, the reference column traces 210 may extend in any direction that enables the capacitive sensor 110 to function as described herein. In an example, each reference column trace 210 is coupled to one reference oscillator 170 for each row trace 180 in the capacitive sensor 110. For example, each row trace 180 is coupled to three reference oscillators 170 and, as such, the capacitive sensor 110 includes three reference column traces 210. Alternatively, each row trace 180 may be coupled to any number of reference oscillators 170 and, as such, any number of reference column traces 210 that enables the capacitive sensor 110 to function as described herein.

In an example, the capacitive sensor 110 is fabricated using printed electronic technology and/or processes and from various materials including copper, transparent materials, indium tin oxide (ITO), printed metal, printed ink, dielectric materials, polyethylene terephthalate (PET), and/or organic positive channel field-effect transistor (pFETs). Alternatively, the capacitive sensor 110 may be fabricated from any materials that enable the capacitive sensor 110 to function as described herein. Any conductor may be used to form the capacitor plates and/or interconnect, and any dielectric material or substrate may be used to separate the capacitor plates. Moreover, any semiconductor may be used to form the field-effect transistors. In an example, the capacitive sensor is fabricated using a solution-processed roll-to-roll print process.

In an example, the controller 120 is configured to receive a parameter associated with the primary oscillators 160 and the reference oscillators 170, and determine an operation associated with the received parameter. For example, the controller 120 is configured to receive a first parameter (e.g., including signal and noise) for at least one primary oscillator 160 and a second parameter (e.g., including noise) for at least one reference oscillator 170, compare the first parameter with the second parameter, and determine the operation based on the comparison between the first parameter and the second parameter.

In an example, the controller 120 is coupled to a row driver 220 coupled to the row traces 180, and a column reader 230 coupled to the sensor column traces 200 and the reference column traces 210. In an example, the row driver 220 and the column reader 230 are implemented with a field-programmable gate array. Alternatively or in addition, the row driver 220 and/or the column reader 230 may be implemented using any technique and/or technology that enable the system 100 to function as described herein.

In an example, the row driver 220 is configured to oscillate or drive the primary oscillators 160 and the reference oscillators 170. More specifically, in an example, the row driver 220 is configured to drive at least one primary oscillator 160 and the reference oscillator 170 associated with the at least one primary oscillator 160 based on a row trace 180 to which the at least one primary oscillator 160 and the reference oscillator 170 are coupled. For example, the row driver 220 is configured to drive the first plurality of primary oscillators 184 and the first plurality of reference oscillators 186 for a predetermined time (e.g., 10 microseconds) and then drive the second plurality of primary oscillators 190 and the second plurality of reference oscillators 192 for a predetermined time (e.g., 10 microseconds) and continue in a predetermined sequential manner. Alternatively or in addition, the primary oscillators 160 and/or the reference oscillators 170 may be driven in any manner that enables the system 100 to function as described herein.

In an example, the column reader 230 is an analog-to-digital converter configured to detect at least one parameter associated with the primary oscillators 160 and the reference oscillators 170 and transmit a signal associated with the parameter to the controller 120. For example, the parameter is associated with a drive or oscillation frequency of at least one primary oscillator 160 and/or at least one reference oscillator 170. Alternatively or in addition, the parameter may be associated with any characteristic that enables the controller 120 to function as described herein. Individually detecting the at least one parameter at each node 140 enables a local analog-to-digital conversion to occur for each node 140 independent of the other nodes 140, thereby enabling multi-touch capability in a shared row/column architecture as well as increased sensitivity.

In an example, the column reader is configured to compute a differential between the primary oscillator 160 and the reference oscillator 170. In one example, the column reader 230 is a comparator that is configured to compare a first oscillation frequency of at least one primary oscillator 160 with a second oscillation frequency of at least one reference oscillator 170, and the column reader 230 is configured to output a signal associated with the difference between the first oscillation frequency and the second oscillation frequency. In such an example, the difference between the first oscillation frequency (e.g., signal plus noise) and the second oscillation frequency (e.g., noise) is a clean signal. Additionally or alternatively, the column reader 230 is a multiplexer that is configured to compare a first oscillation frequency for each of a plurality of primary oscillators 160 with a second oscillation frequency for each of a plurality of reference oscillators 170, and the column reader 230 is configured to output a signal associated with the difference between the first oscillation frequency and the second oscillation frequency. In an example, the column reader 230 includes a memory unit configured to store at least one parameter. Alternatively, the parameter may be detected and/or the signal may be determined or transmitted in any manner that enables the controller 120 to function as described herein.

Figure 2:
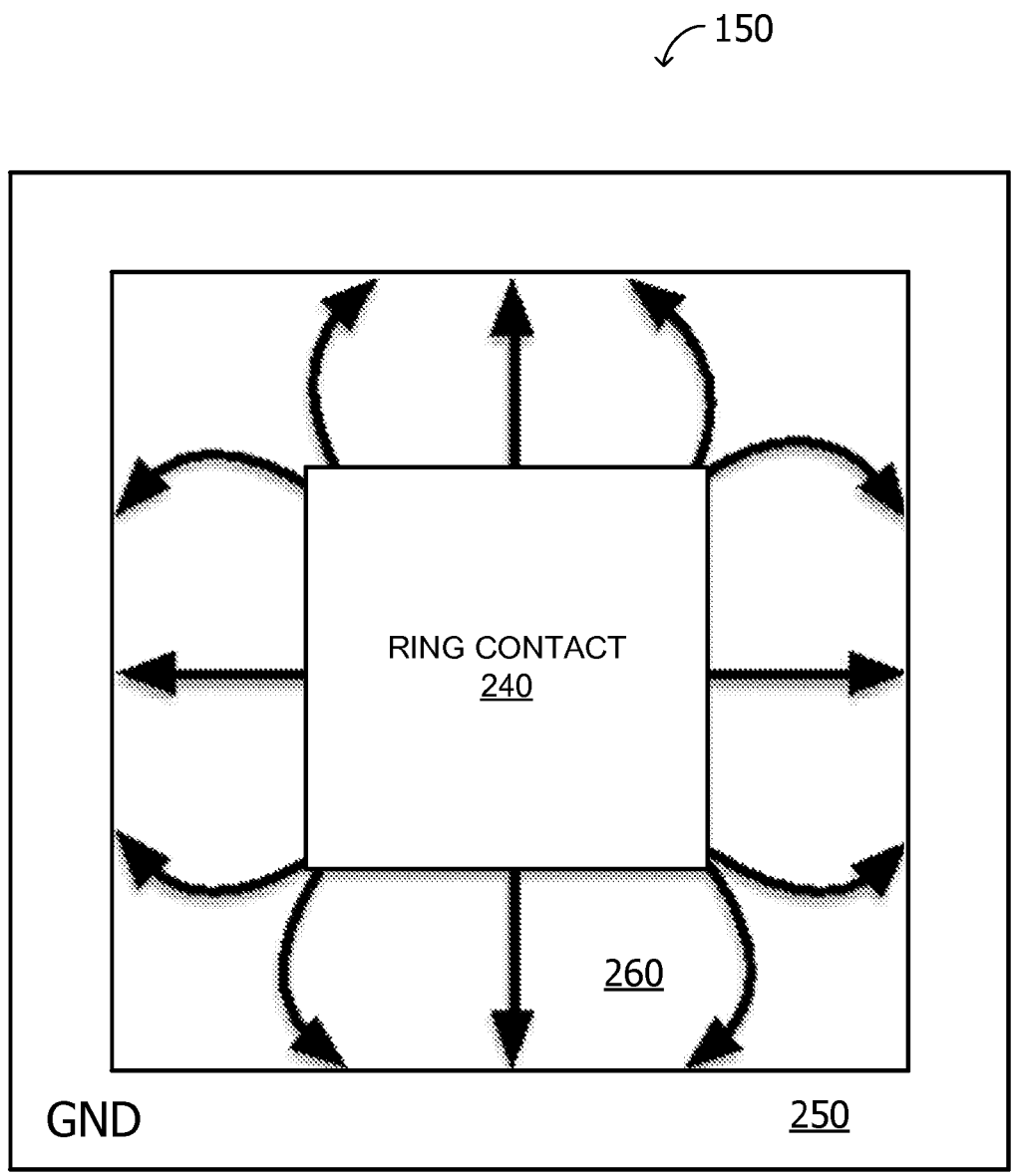
FIG. 2 is an example schematic diagram illustrating a capacitive sense pad used with a logical architecture such as shown in FIG. 1.

FIG. 2 is an example schematic diagram illustrating a capacitive sense pad 150. In an example, each sense pad 150 includes a ring contact 240 and a reference voltage or ground 250 surrounding or circumscribing the ring contact 240, such that there is at least some space 260 between the ring contact 240 and the ground 250. In an example, the sense pad 150 is associated with a parameter that is configured to change as an input device (e.g., a user finger, stylus) (not shown) approaches or withdraws from the sense pad 150. For example, a capacitance associated with the sense pad 150 increases as the input device approaches the sense pad 150 and, conversely, decreases as the input device withdraws from the sense pad 150. In this example, the electric field and/or energy passing from the ring contact 240 towards the ground 250 is depicted with flux arrows.

In an example, the ground 250 surrounds or circumscribes the ring contact 240, such that at least a portion of the ground 250 is between the ring contact 240 and an adjacent ring contact (not shown). Accordingly, in an example, the space 260 and the portion of the ground 250 between adjacent ring contacts 240 is configured to act as a buffer for the ring contact 240 and facilitates reducing a susceptibility and/or vulnerability of the ring contact 240 to noise.

Figure 3:
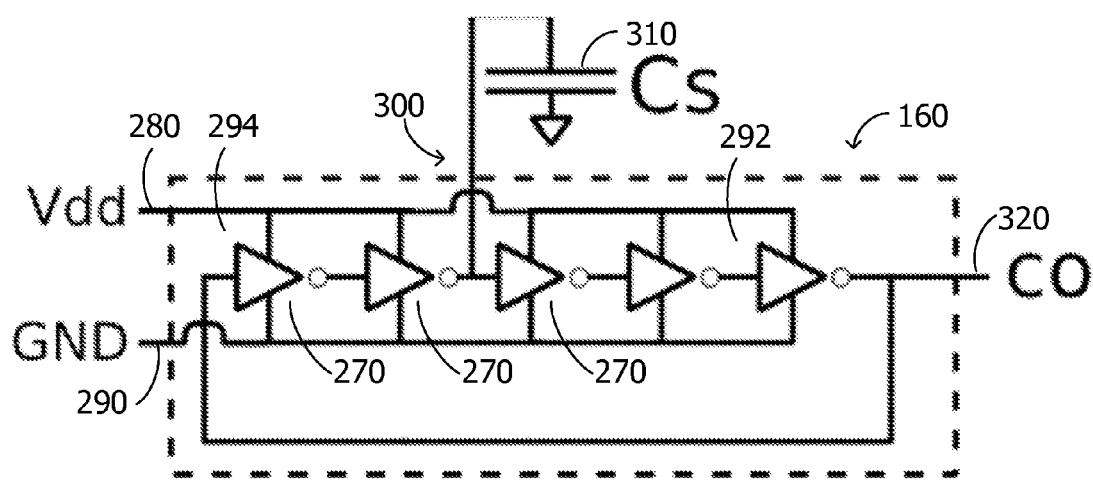
FIG. 3 is an example schematic diagram illustrating a ring oscillator used with a logical architecture such as shown in FIG. 1.

FIG. 3 is an example schematic diagram illustrating a primary oscillator 160. In an example, the primary oscillator 160 includes a plurality of inverters 270 coupled in series between a voltage source node 280 and a reference voltage or ground node 290. Although only five inverters 270 are depicted in this example, the primary oscillator 160 may include any odd number of inverters 270 that enables the primary oscillator 160 to function as described herein.

Each inverter 270 receives an input and occupies or takes a finite amount of time (e.g., time-delay) to output an inverse of the input. In an example, the inverters 270 are arranged in a ring configuration, such that an output of the last inverter 292 is input into the first inverter 294, thereby creating a feedback that causes an oscillation having an oscillation frequency.

In an example, the primary oscillator 160 includes a capacitive node 300 coupled to at least one of the inverters 270. In an example, the capacitive node 300 is coupled to a capacitor 310 (e.g., sense pad 150). Alternatively, the capacitive node 300 may be coupled to any device that enables the system 100 to function as described herein. In an example, when a capacitance associated with the capacitor 310 increases, an oscillation frequency associated with the primary oscillator 160 decreases. Conversely, in an example, when a capacitance associated with the capacitor 310 decreases, an oscillation frequency associated with the primary oscillator 160 increases.

In an example, an output node 320 is configured to output a signal associated with the primary oscillator 160. For example, the output node 320 is coupled to and is configured to transmit a signal to the column reader 230. In an example, the signal is associated with an oscillation frequency of the primary oscillator 160. For example, the signal is a square wave oscillating between a lower oscillation frequency and a higher oscillation frequency and changes as a capacitance associated with the capacitor 310 changes.

Figure 4:
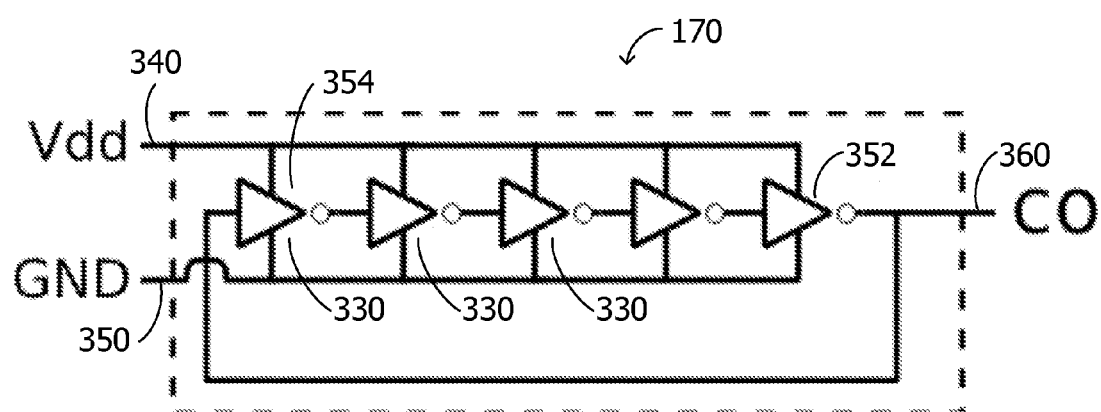
FIG. 4 is an example schematic diagram illustrating another ring oscillator used with a logical architecture such as shown in FIG. 1.

FIG. 4 is an example schematic diagram illustrating a reference oscillator 170. In an example, the reference oscillator 170 is substantially similar to the primary oscillator 160 (shown in FIG. 3), such that the reference oscillator 170 is configured to provide a local environmental reference (e.g., a baseline) for a primary oscillator 160 adjacent the reference oscillator 170. In an example, the reference oscillator 170 includes a plurality of inverters 330 coupled in series between a voltage source node 340 and a reference voltage or ground node 350. Although only five inverters 330 are depicted in this example, the reference oscillator 170 may include any odd number of inverters 330 that enables the reference oscillator 170 to function as described herein.

Same or similar to the inverter 270, each inverter 330 receives an input and occupies or takes a finite amount of time (e.g., time-delay) to output an inverse of the input. In an example, the inverters 330 are arranged in a ring configuration, such that an output of the last inverter 352 is input into the first inverter 354, thereby creating a feedback that causes an oscillation having an oscillation frequency.

In an example, an output node 360 is configured to output a signal associated with the reference oscillator 170. For example, the output node 320 is coupled to and is configured to transmit a signal to the column reader 230. In an example, the signal is associated with an oscillation frequency of the reference oscillator 170. For example, the signal is a square wave oscillating between a lower oscillation frequency and a higher oscillation frequency.

In contrast to the primary oscillator 160, the reference oscillator 170 does not include a capacitive node and is independent of a sense pad. Accordingly, an environmental condition, for example, that affects an oscillation frequency of the primary oscillator 160 is accounted for by considering an effect on an oscillation frequency of the reference oscillator 170. That is, in at least some examples, the aggregate affect to the primary oscillator 160 less the aggregate affect to the reference oscillator 170 is determined to be an affect accredited to a user interaction. Alternatively, the user interaction may be determined based on any other criteria that enable the system 100 to function as described herein.

Figure 5:
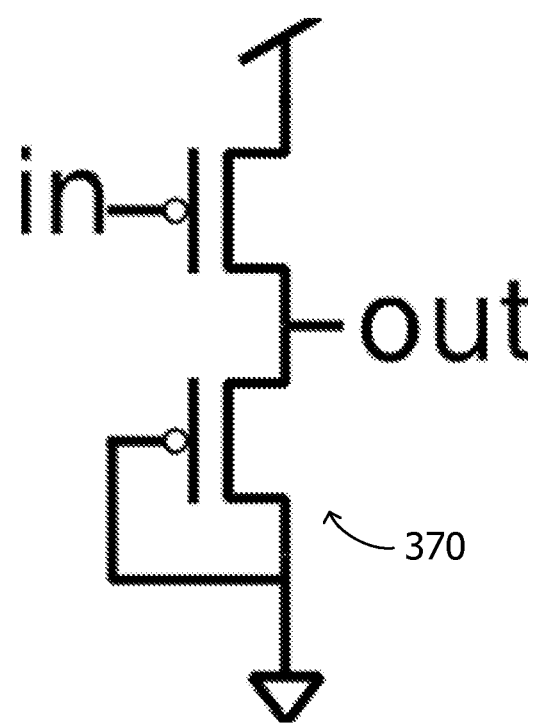
FIG. 5 is an example schematic diagram illustrating an inverter used with a ring oscillator such as shown in FIGS. 3 and 4.

FIG. 5 is an example schematic diagram illustrating an inverter 370 that may be used with a primary oscillator 160 (shown in FIG. 3) and/or a reference oscillator 170 (shown in FIG. 4). For example, the inverter 370 may be used as an inverter 270 (shown in FIG. 3) in a primary oscillator 160 and/or as an inverter 330 (shown in FIG. 4) in a reference oscillator 170. In an example, the inverter 370 is a ratioed negative channel field effect transistor (NFET) or a ratioed positive channel field effect transistor (PFET). In an example, the primary oscillator 160 and/or the reference oscillator 170 includes one or more NFETs and/or one or more PFETs. The primary oscillator 160 and/or the reference oscillator 170 may include any combination of inverters and/or transistors that enables the primary oscillator 160 and/or the reference oscillator 170 to function as described herein. Examples described herein do not require a combination of both NFETs and PFETs, nor do examples described herein require a complementary metal-oxide-semiconductor (CMOS) for the primary oscillator 160 and/or the reference oscillator 170 to function as described herein.

Figure 6:
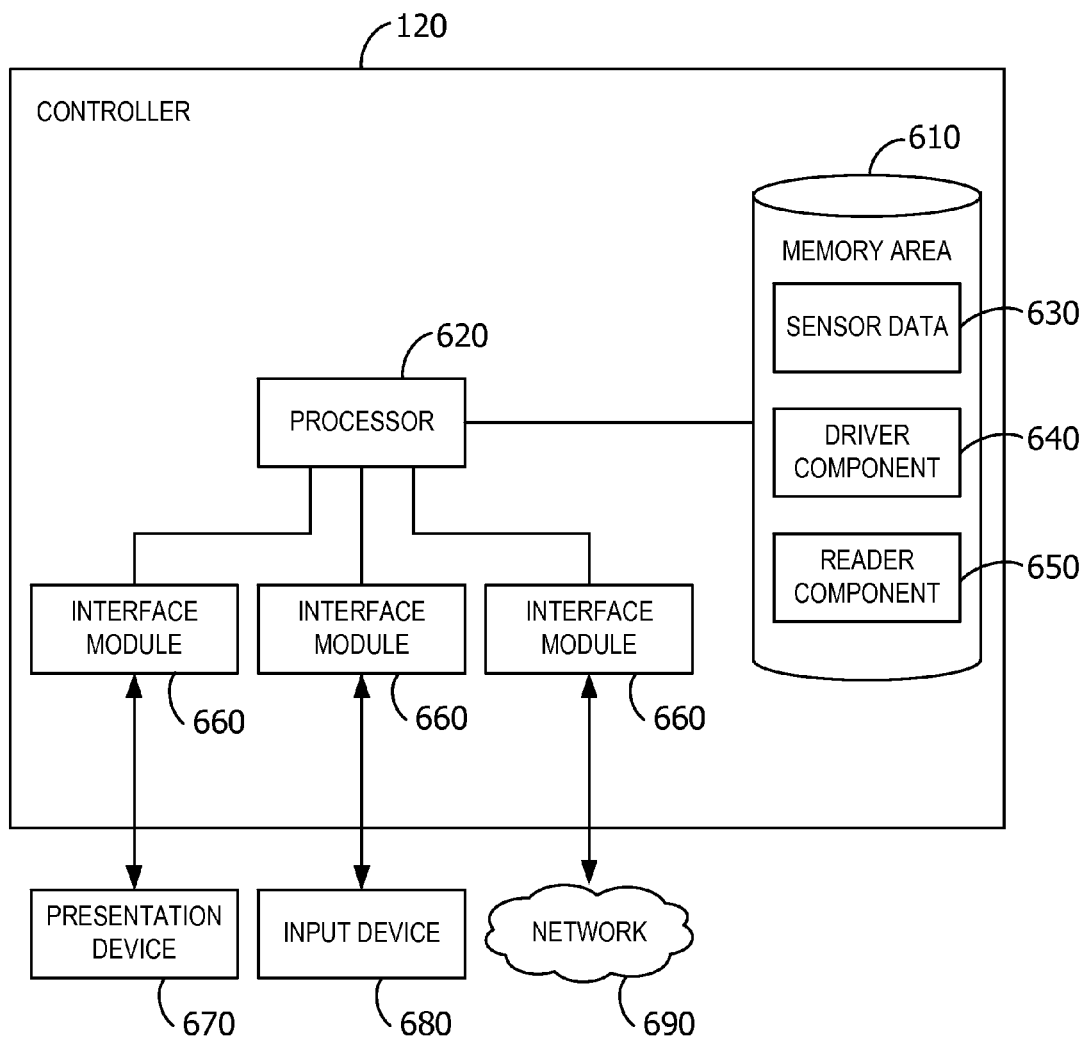
FIG. 6 is an example block diagram illustrating a controller used with a logical architecture such as shown in FIG. 1.

FIG. 6 is an example block diagram illustrating a circuit or controller 120. The controller 120 includes one or more computer-readable media, such as a memory area 610 storing computer-executable instructions, sensor data, and/or other data, and at least one processor 620 configured to execute the computer-executable instructions for implementing aspects of the disclosure. The memory area 610 includes any quantity of media associated with or accessible by the controller 120. The memory area 610 may be internal to the controller 120 (as shown in FIG. 6), external to the controller 120 (not shown), or both (not shown).

In some examples, the memory area 610 stores, among other data, one or more applications. The applications, when executed by the processor 620, operate to perform functionality on the controller 120. Example applications include mail application programs, web browsers, calendar application programs, address book application programs, messaging programs, media applications, location-based services, search programs, and the like. The applications may communicate with counterpart applications or services such as web services accessible via a network (not shown). For example, the applications may represent downloaded client-side applications that correspond to server-side services executing in a cloud.

In this example, the memory area 610 stores one or more computer-executable components for providing an active matrix capacitive touch sensor including, but not limited to, sensor data 630, a driver component 640 and/or a reader component 650. While the sensor data 630, the driver component 640, and the reader component 650 are shown to be stored in the memory area 610, the sensor data 630, the driver component 640, and/or the reader component 650 may be stored and/or executed from a memory area remote from the controller 120. For example, the sensor data 630, the driver component 640, and/or the reader component 650 may be stored in a cloud service, a database, or other memory area accessible by the controller 120. Such examples reduce the computational and storage burden on the controller 120.

The processor 620 includes any quantity of processing units, and the instructions may be performed by the processor 620 or by multiple processors within the controller 120 or performed by a processor external to the controller 120. In some examples, the processor 620 is configured to execute instructions such as those illustrated in the figures (e.g., FIG. 7).

In some examples, the processor 620 is transformed into a special purpose microprocessor by executing computer-executable instructions or by otherwise being configured. For example, the driver component 640, when executed by the processor 620, causes the processor 620 to drive a plurality of primary oscillators 160 and a plurality of reference oscillators 170. Additionally, the reader component 650, when executed by the processor 620, causes the processor 620 to receive a parameter associated with the plurality of primary oscillators 160 and the plurality of reference oscillators 170, and determine an operation associated with the received parameter. For example, the reader component 650 causes the processor 620 to compare a first parameter associated with a primary oscillator 160 and a second parameter associated with a reference oscillator 170. The sensor data 630 corresponds to data (e.g., capacitance, oscillation frequency) that may be received by the reader component 650. Although processor 620 is shown separate from the memory area 610, examples of the disclosure contemplate that the memory area 610 may be onboard the processor 620 such as in some embedded systems.

In some examples, the controller 120 includes at least one interface module 660 for exchanging data between the controller 120 and a user, computer-readable media, and/or another computing device (not shown). In at least some examples, the interface module 660 is coupled to a presentation device 670 configured to present information, such as text, images, audio, video, graphics, alerts, and the like, to the user. For example, the presentation device 670 may include, without limitation, a display, speaker, and/or vibrating component. Additionally or alternatively, the interface module 660 is coupled to an input device 680 configured to receive information, such as user commands, from the user. For example, the input device 680 may include, without limitation, a keyboard, mouse, camera, and/or microphone. In at least some examples, the presentation device 670 and the input device 680 may be integrated in a common user-interface device (not shown) configured to present information to the user and receive information from the user. For example, the user-interface device may include, without limitation, a capacitive touch screen display.

In at least some examples, the interface module 660 is coupled to computer-readable media and/or another computing device via a network 690 to enable automatic sharing of media content and more among computing devices. Communication between the controller 120 and other computing devices may occur using any protocol or mechanism over any wired or wireless connection.

The block diagram of FIG. 6 is merely illustrative of an example controller 120 that may be used in connection with one or more examples of the disclosure and is not intended to be limiting in any way. Further, peripherals or components of the controller 120 known in the art are not shown, but are operable with aspects of the disclosure. At least a portion of the functionality of the various elements in FIG. 6 may be performed by other elements in FIG. 6, or an entity (e.g., processor, web service, server, application program, computing device, etc.) not shown in FIG. 6.

Figure 7:
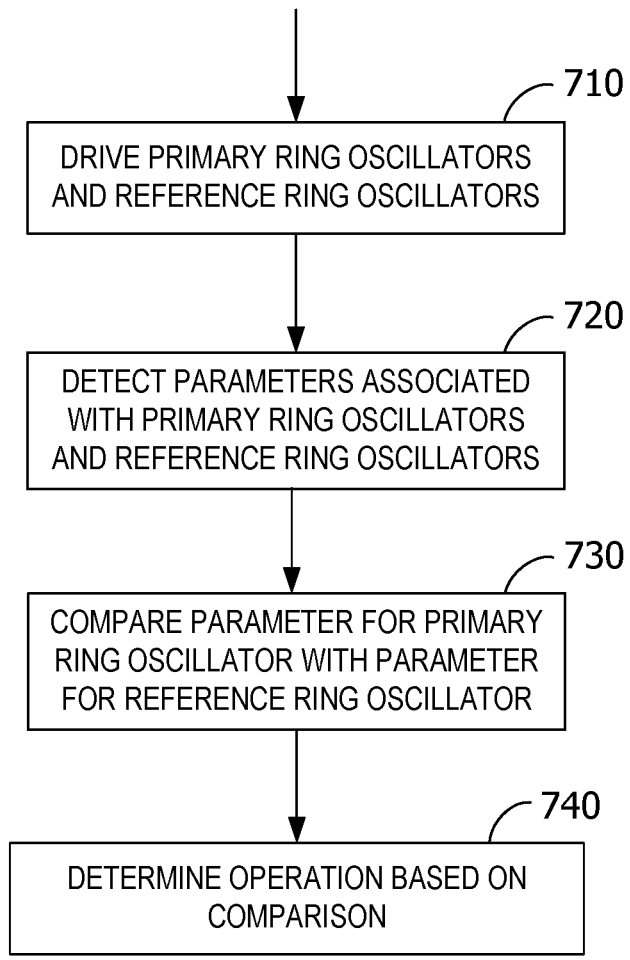
FIG. 7 is an example flow chart illustrating operation of a logical architecture, such as shown in FIG. 1, to determine an operation associated with a corresponding touch.

FIG. 7 is an example flow chart illustrating a method 700 to provide an active matrix capacitive touch sensor. In an example, a row driver 220 drives at operation 710 a plurality of primary oscillators 160 and a plurality of reference oscillators 170. More specifically, the row driver 220 drives a primary oscillator 160 and a reference oscillator 170 associated with the primary oscillator 160 based on a row trace 180 to which the primary oscillator 160 and the reference oscillator 170 are coupled. For example, in an example, the row driver 220 drives one row of primary oscillators 160 and reference oscillators 170 at a time in a predetermined looping pattern. When a row is "active", each primary oscillator 160 in the row drives or oscillates a sensor column trace 200, and each reference oscillator 170 in the row drives or oscillates a reference column trace 210. Alternatively, the primary oscillators and reference oscillators may be driven in any order and/or pattern that enables the system 100 to function as described herein.

In an example, a column reader 230 detects at operation 720 parameters (e.g., capacitance, oscillation frequency) associated with the primary oscillators 160 via the sensor column trace 200 and the reference oscillators 170 via the reference column trace 210. In an example, the column reader 230 measures the parameter, and transmits a signal associated with the detected parameter to the controller 120.

In an example, the controller 120 receives the signal from the column reader 230 and determines an operation associated with the received signal. In an example, the signal includes a first parameter (e.g., capacitance, oscillation frequency) for a primary oscillator 160 and a second parameter (e.g., capacitance, oscillation frequency) for a reference oscillator 170, and the controller 120 compares at operation 730 the first parameter with the second parameter. In an example, the controller 120 determines the operation at operation 740 based on the comparison of the first parameter with the second parameter.

Micro Electro Mechanical System (MEMS) technologies relate to an edge and cross science an application of which is the use of MEMS technologies to provide an active matrix capacitive touch sensor, as described herein. An active matrix capacitive touch sensor using the MEMS technologies provides features of a small volume, low power consumption, a superior electric performance etc., as compared with a conventional capacitive touch sensor.

The subject matter described herein enables providing an active matrix capacitive touch sensor. The examples of the disclosure enable an electronic device to detect a touch and implement an operation corresponding to the touch with an increased sensitivity and multi-touch capability in a cost-effective and scalable manner, thereby providing the benefits of both self-capacitance and mutual-capacitance systems. The increased sensitivity and multi-touch capability enable a signal-to-noise ratio to be increased, such that the touch sensor is usable in a "glove" mode and/or with "hover" capabilities, wherein the touch sensor is sensitive to user touch while an object (e.g., a portion of a glove) is between the user and the touch sensor and/or the user is proximate to, but not directly in contact with (e.g., within approximately 5-10 mm), the touch sensor, respectively.

Example computer readable media include flash memory drives, digital versatile discs (DVDs), compact discs (CDs), floppy disks, and tape cassettes. By way of example and not limitation, computer readable media comprise computer storage media and communication media. Computer storage media include volatile and nonvolatile, removable and non-removable media implemented in any method or technology for storage of information such as computer readable instructions, data structures, program modules or other data. Computer storage media are tangible and mutually exclusive to communication media. Computer storage media are implemented in hardware and exclude carrier waves and propagated signals. Computer storage media for purposes of this disclosure are not signals per se. Example computer storage media include hard disks, flash drives, and other solid-state memory. In contrast, communication media typically embody computer readable instructions, data structures, program modules, or other data in a modulated data signal such as a carrier wave or other transport mechanism and include any information delivery media.

Although described in connection with an example computing system environment, examples of the disclosure are capable of implementation with numerous other general purpose or special purpose computing system environments, configurations, or devices.

Examples of well-known computing systems, environments, and/or configurations that may be suitable for use with aspects of the disclosure include, but are not limited to, mobile computing devices, personal computers, server computers, hand-held or laptop devices, multiprocessor systems, gaming consoles, microprocessor-based systems, set top boxes, configurable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, and the like. Such systems or devices may accept input from the user in any way, including from input devices such as a keyboard or pointing device, via gesture input, proximity input (such as by hovering), and/or via voice input.

Examples of the disclosure may be described in the general context of computer-executable instructions, such as program modules, executed by one or more computers or other devices in software, firmware, hardware, or a combination thereof. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other examples of the disclosure may include different computer-executable instructions or components having more or less functionality than illustrated and described herein.

Aspects of the disclosure transform a general-purpose computer into a special-purpose computing device when configured to execute the instructions described herein.

The examples illustrated and described herein as well as examples not specifically described herein but within the scope of aspects of the disclosure constitute example means for providing an active matrix capacitive touch sensor. For example, the elements illustrated in FIGS. 1 and 6, such as when encoded to perform the operations illustrated in FIG. 7, constitute example means for driving an oscillator, example means for receiving a parameter associated with the oscillator, example means for comparing parameters; and example means for determining an operation associated with the received parameter.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

Alternatively or in addition to the other examples described herein, examples include any combination of the following:

- a plurality of capacitive sense pads;
- a capacitive sense pad;
- a capacitive sense pad including a contact and a ground circumscribing the contact, such that a susceptibility of the contact to noise is reduced;
- a primary ring oscillator coupled to a respective capacitive sense pad;
- a primary ring oscillator including an odd number of inverters;
- a plurality of reference ring oscillators associated with a respective primary ring oscillator;
- a reference ring oscillator including an odd number of inverters;
- a reference ring oscillator adjacent a primary ring oscillator;
- a row trace coupled to at least one primary ring oscillator and a reference ring oscillator for each primary ring oscillator;
- a plurality of primary ring oscillators coupled to a row trace;
- a primary ring oscillator coupled to a plurality of row traces;
- a plurality of reference ring oscillators coupled to a row trace;
- a reference ring oscillator coupled to a plurality of row traces;
- at least one sensor column trace coupled to one primary ring oscillator for each row trace;
- at least one reference column trace coupled to one reference ring oscillator for each row trace;
- a driver coupled to the row traces, the driver configured to drive the primary ring oscillators and the reference ring oscillators;

a driver configured to drive the at least one primary ring oscillator and the reference ring oscillator based on a row trace to which the at least one primary ring oscillator and the reference ring oscillator are coupled;

a reader coupled to at least one sensor column trace, at least one reference column trace, and a controller, the reader configured to detect an oscillation frequency associated with the primary ring oscillators and the reference ring oscillators, and transmit the parameter to the controller;

driving the primary ring oscillators and the reference ring oscillators;

driving a primary ring oscillator and a reference ring oscillator based on a row trace to which the primary ring oscillator and the reference ring oscillator are coupled;

detecting an oscillation frequency associated with the primary ring oscillators and the reference ring oscillators, and transmitting the parameter to the controller;

receiving a parameter associated with the primary ring oscillators and the reference ring oscillators;

determining an operation associated with the received parameter.

receiving a first parameter for a primary ring oscillator and a second parameter for a reference ring oscillator;

comparing the first parameter with the second parameter; and determining an operation based on the comparison between the first parameter and the second parameter.

In some examples, the operations illustrated in FIG. 6 may be implemented as software instructions encoded on a computer readable medium, in hardware configured or designed to perform the operations, or both. For example, aspects of the disclosure may be implemented as a system on a chip or other circuitry including a plurality of interconnected, electrically conductive elements.

While the aspects of the disclosure have been described in terms of various examples with their associated operations, a person skilled in the art would appreciate that a combination of operations from any number of different examples is also within scope of the aspects of the disclosure.

What is claimed is:

1. A system comprising:
   a capacitive sensor comprising:
      a plurality of capacitive sense pads;
      a plurality of primary ring oscillators, each primary ring oscillator coupled to a respective capacitive sense pad;
      a plurality of reference ring oscillators, each reference ring oscillator associated with a respective primary ring oscillator;
      a plurality of row traces, each row trace coupled to at least one primary ring oscillator and a reference ring oscillator for each primary ring oscillator of the at least one primary ring oscillator;
      at least one sensor column trace coupled to one primary ring oscillator for each row trace of the plurality of row traces; and
      at least one reference column trace coupled to one reference ring oscillator for each row trace of the plurality of row traces; and
   a controller configured to receive a parameter associated with the plurality of primary ring oscillators and the plurality of reference ring oscillators, and determine an operation associated with the received parameter.

2. The system of claim 1, wherein each capacitive sense pad includes a contact and a ground circumscribing the contact, such that a susceptibility of the contact to noise is reduced.

3. The system of claim 1, wherein the plurality of primary ring oscillators comprises a first plurality of primary ring oscillators and a second plurality of primary ring oscillators, and the plurality of row traces includes a first row trace and a second row trace, the first plurality of primary ring oscillators coupled to the first row trace, the second plurality of primary ring oscillators coupled to the second row trace.

4. The system of claim 1, wherein the plurality of reference ring oscillators comprises a first plurality of reference ring oscillators and a second plurality of reference ring oscillators, and the plurality of row traces includes a first row trace and a second row trace, the first plurality of reference ring oscillators coupled to the first row trace, the second plurality of reference ring oscillators coupled to the second row trace.

5. The system of claim 1, wherein each primary ring oscillator and each reference ring oscillator comprises an odd number of inverters coupled in a first configuration.

6. The system of claim 1, wherein each reference ring oscillator is adjacent the primary ring oscillator with which the reference ring oscillator is associated.

7. The system of claim 1, wherein the controller is further configured to receive a first parameter for at least one primary ring oscillator and a second parameter for at least one reference ring oscillator, and determine the operation based on a comparison between the first parameter and the second parameter.

8. The system of claim 1, further comprising a driver coupled to the plurality of row traces, the driver configured to drive the plurality of primary ring oscillators and the plurality of reference ring oscillators.

9. The system of claim 8, wherein the driver is configured to drive the at least one primary ring oscillator and the reference ring oscillator based on a row trace to which the at least one primary ring oscillator and the reference ring oscillator are coupled.

10. The system of claim 1, further comprising a reader coupled to the at least one sensor column trace, the at least one reference column trace, and the controller, the reader configured to detect an oscillation frequency associated with the plurality of primary ring oscillators and the plurality of reference ring oscillators, and transmit the parameter to the controller.

11. A sensor comprising:
   a plurality of first oscillators;
   a plurality of second oscillators, each second oscillator of the plurality of second oscillators associated with a respective first oscillator of the plurality of first oscillators;
   at least one row trace, each row trace of the at least one row trace coupled to at least one first oscillator of the plurality of first oscillators and a second oscillator of the plurality of second oscillator for each first oscillator of the at least one first oscillator;
   at least one first column trace coupled to one first oscillator of the plurality of first oscillators for each row trace of the at least one row trace; and
   at least one second column trace coupled to one second oscillator of the plurality of second oscillators for each row trace of the at least one row trace.

12. The sensor of claim 11, further comprising a plurality of capacitive sense pads, each capacitive sense pad of the plurality of capacitive sense pads coupled to a respective first oscillator of the plurality of first oscillators.

13. The sensor of claim 12, wherein each capacitive sense pad of the plurality of capacitive sense pads includes a contact and a ground circumscribing the contact.

14. The sensor of claim 11, wherein the plurality of first oscillators comprises a first plurality of first oscillators and a second plurality of first oscillators, and the at least one row trace includes a first row trace and a second row trace, the first plurality of first oscillators coupled to the first row trace, the second plurality of first oscillators coupled to the second row trace.

15. The sensor of claim 11, wherein the plurality of second oscillators comprises a first plurality of second oscillators and a second plurality of second oscillators, and the at least one row trace includes a first row trace and a second row trace, the first plurality of second oscillators coupled to the first row trace, the second plurality of second oscillators coupled to the second row trace.

16. The sensor of claim 11, wherein each first oscillator of the plurality of first oscillators and each second oscillator of the plurality of second oscillators comprises an odd number of inverters coupled in a first configuration.

17. The sensor of claim 11, wherein each second oscillator of the plurality of second oscillators is adjacent the first oscillator with which the second oscillator is associated.

18. A system comprising:
a sensor comprising:
a plurality of sense pads;
a plurality of first oscillators, each first oscillator coupled to a respective sense pad;
a plurality of second oscillators, each second oscillator associated with a respective first oscillator;
a plurality of row traces, each row trace coupled to at least one first oscillator and a second oscillator for each first oscillator of the at least one first oscillator;
at least one first column trace coupled to one first oscillator for each row trace of the plurality of row traces; and
at least one second column trace coupled to one second oscillator for each row trace of the plurality of row traces; and
a circuit configured to receive a parameter associated with the plurality of first oscillators and the plurality of second oscillators, and determine an operation associated with the received parameter.

19. The system of claim 18, wherein the circuit is further configured to receive a first parameter for at least one first oscillator and a second parameter for at least one corresponding second oscillator, and determine the operation based on a comparison between the first parameter and the second parameter.

20. The system of claim 18, wherein the circuit is further configured to enable the at least one first oscillator and the second oscillator to be driven based on a row trace to which the at least one first oscillator and the second oscillator are coupled.

* * * * *